United States Patent [19]
Ritchey

[11] Patent Number: 5,670,744
[45] Date of Patent: Sep. 23, 1997

[54] ENTRY PORT SYSTEMS FOR CONNECTING CO-AXIAL CABLES TO PRINTED CIRCUIT BOARDS

[76] Inventor: Carey Ritchey, 29 Bedard Crescent, Port Moody, B.C., Canada, V3H 1P4

[21] Appl. No.: 298,162

[22] Filed: Aug. 30, 1994

[51] Int. Cl.⁶ ........................................ H05K 5/02
[52] U.S. Cl. .............. 174/51; 174/65 R; 439/95; 439/578; 439/581
[58] Field of Search .............. 174/65 R, 65 SS, 174/65 G, 51; 439/578, 581, 675, 95, 98

[56] References Cited

U.S. PATENT DOCUMENTS

| | | | |
|---|---|---|---|
| 3,486,161 | 12/1969 | Kraus et al. | 439/578 X |
| 4,035,054 | 7/1977 | Lattanzi | 439/578 |
| 4,342,496 | 8/1982 | Hutter et al. | 439/578 |
| 4,426,127 | 1/1984 | Kubota | 439/578 X |
| 4,851,609 | 7/1989 | Reddy | 174/35 R |
| 5,203,079 | 4/1993 | Brinkman et al. | 29/860 |
| 5,281,762 | 1/1994 | Long et al. | 174/78 |
| 5,312,271 | 5/1994 | Matsumoto et al. | 439/578 |
| 5,466,167 | 11/1995 | Scherer | 439/578 X |
| 5,477,159 | 12/1995 | Hamling | 324/754 |

FOREIGN PATENT DOCUMENTS 1150754  6/1963  Germany ............ 174/65 R X

Primary Examiner—Kristine L. Kincaid
Assistant Examiner—Dean A. Reichard
Attorney, Agent, or Firm—Brian M. Long

[57] ABSTRACT

An entry port system for connecting a co-axial cable to a printed circuit board within a housing has a terminating connector on the cable at the exterior of the housing and a connector member within the housing and connected to the cable shield. The printed circuit board is secured to the connector member so as to be supported and grounded thereby. A terminal, mounted on the printed circuit board, holds a central conductor of the terminating conductor, which extends through a passage in the connector member, at a spacing from the connector member, so that an air gap surrounds the central conductor in the passage. The size of the air gap is selected so that the entry port system acts as a co-axial transmission system having an impedance substantially equal to that of the cable.

9 Claims, 3 Drawing Sheets

5,670,744

ENTRY PORT SYSTEMS FOR CONNECTING CO-AXIAL CABLES TO PRINTED CIRCUIT BOARDS

BACKGROUND OF THE INVENTION

1. Field of the Invention

The present invention relates to entry port systems for connecting co-axial cables through the walls of housings to printed circuit boards within the housings and is useful in particular, but not exclusively, in cable television systems.

2. Description of the Related Art

In cable television system, it is at the present time customary to mount a printed circuit board within a housing by supporting the printed circuit board on posts extending upwardly into the interior of the housing from the base of the housing. With this arrangement, a co-axial cable is secured to a housing by means of a connector, with the central conductor of the cable, commonly referred to as the "stinger", projecting into the interior of the housing through an entry port in a wall of the housing. Within the housing, the stinger is connected to a circuit board, which is supported on the posts extending upwardly from the base of the housing.

In that case, the current from the stinger flows through the printed circuit board and the posts to the base of the housing and then through the connector to the outer conductor or shield of the cable, which is terminated at the exterior of the housing. This current flow therefore has a relatively long return path to the cable shield, which causes parasitic inductance and limits the useful bandwidth of the entry port.

BRIEF SUMMARY OF THE INVENTION

According to the present invention, there is provided an entry port system for a co-axial cable having a first central conductor and an outer shield, the entry port system comprising a housing having a wall and an entry port formed in the wall, with a terminating connector provided at the exterior of the housing at one end of the co-axial cable and connecting the co-axial cable to the entry port. The terminating connector has a second central conductor connected to the first central conductor. A connector member located within the housing is secured by a fastener to the wall at the entry port, the terminating connector forming an electrical connection between the connector member and the outer shield of the co-axial cable. A printed circuit board located within the housing is grounded through the connector member, the terminating connector and the outer shield, and the connector member is formed with a passage through which the second central conductor projects into the interior of the housing, a terminal being provided within the housing and electrically connecting the second central conductor to the printed circuit board.

The connector member provides improved grounding, and a shorter RF ground return length, than was possible with the above-described prior an arrangement.

Preferably, an air gap in the passage between the second central conductor and the connector member is dimensioned so that the entry port system acts as a co-axial transmission system matched to the impedance of the co-axial cable.

BRIEF DESCRIPTION OF THE DRAWINGS

Further advantages, features and objects of the present invention will be more readily apparent from the following description thereof when taken in conjunction with the accompanying drawings, in which.

DESCRIPTION OF THE PREFERRED EMBODIMENT

Figure 1:
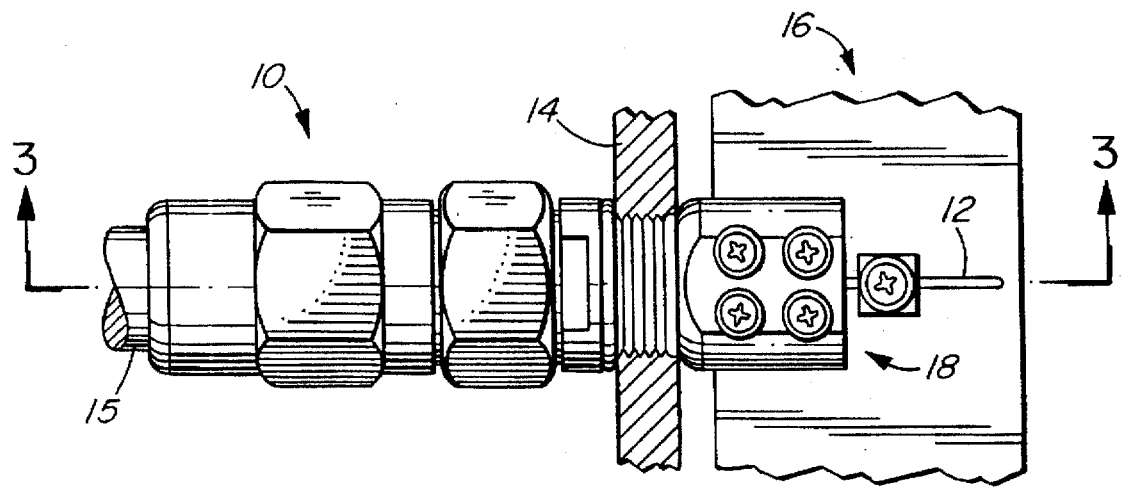
FIG. 1 shows a plan view of an entry port system according to the present invention.
Figure 2:
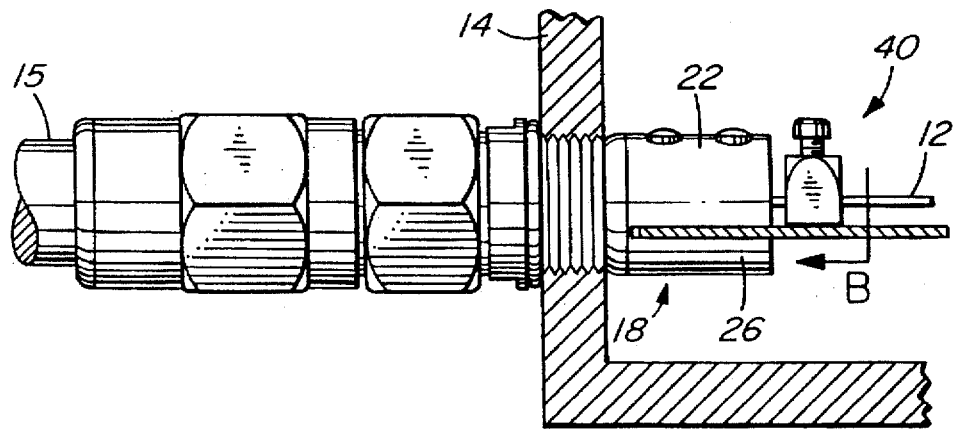
FIG. 2 show a view in side elevation of the entry port system of FIG. 1.
Figure 3:
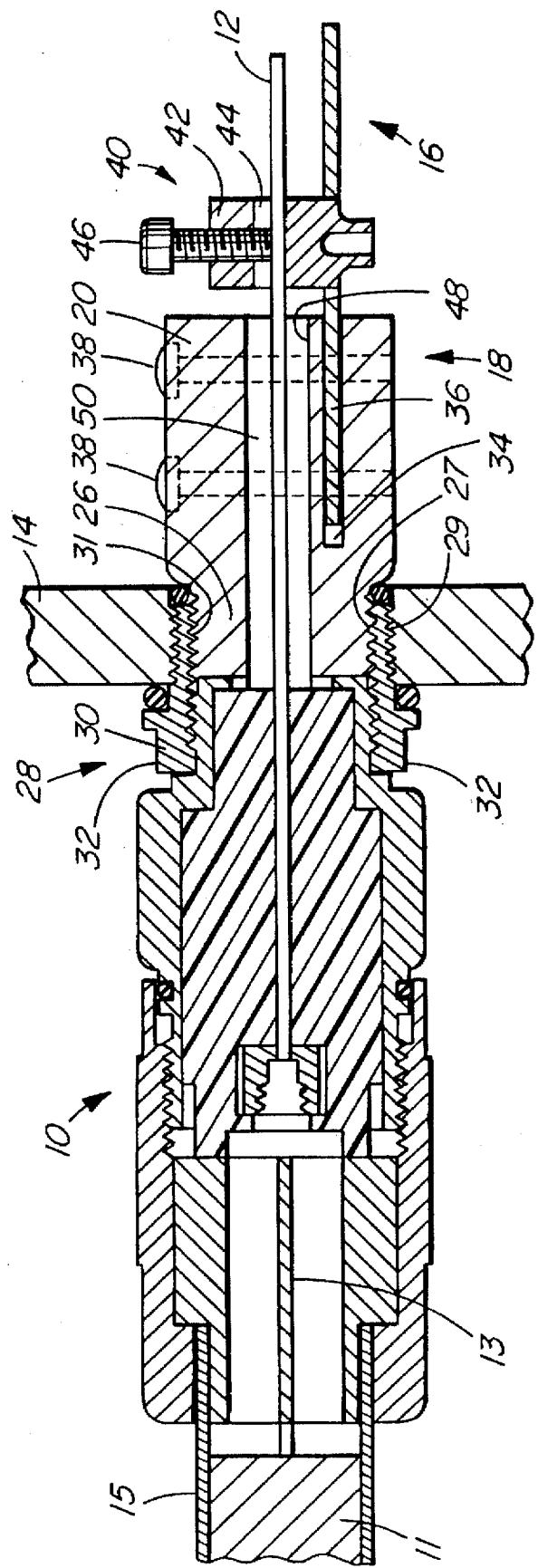
FIG. 3 shows a view taken in longitudinal cross-section, along the line 3—3 of FIG. 1, through the entry port system of FIG. 1.

The entry port system illustrated in FIGS. 1–3 of the accompanying drawings includes a terminating connector indicated generally by reference numeral 10, which is a commercially available connector, and which is provided on one end of a co-axial cable 11, which has a central conductor 13 and an outer shield 15.

As shown in FIG. 3, a central conductor of the connector 10, which is indicated generally by reference numeral 12 and which is sometimes referred to as a "stinger", is connected to the cable central conductor 13 and projects from the connector 10 through a wall 14 of a housing. The conductor 12 is connected, as described in greater detail below, to a printed circuit board indicated generally by reference numeral 16.

The printed circuit board 16 is supported by a further connector indicated generally by reference numeral 18 from the housing wall 14. The connector 18 includes a connector member or body 20, which is generally cylindrical in shape, with flat top and bottom surfaces 22 and 24, and a first fastener indicated generally by reference numeral 28. As can be seen from FIG. 3, the connector body 20 has, at one end, a cylindrical, externally-threaded extension 26, which extends into an entry port 31 in the housing wall 14.

The fastener, 28, is provided with an internal screw thread 27 which in threaded engagement with the connector body extension 26. The fastener 28 is secured to the housing wall 14 by means of an external thread 29 on the fastener 28, which is in threaded engagement with the entry port 31 in the housing wall 14. The fastener 28 is formed at its outer end with a cylindrical portion 30, on which opposed flats 32 are provided for engagement of a wrench (not shown) with the fastener 28.

The internal screw thread 27 of the fastener 28 is also in threaded engagement with the connector 10.

The connector body 20 is formed with a slot 34, which receives an edge portion 36 of the printed circuit board 16. Four second fasteners in the form of screws 38, which are arranged in pairs at opposite sides of the central conductor 12, extend through the connector body 20, the slot 34 and the printed circuit board edge portion 36 and are in threaded engagement with the connector body 20 so as to secure the edge portion 36 in the slot 34. If desired, only a single screw 38 may be employed for this purpose.

A terminal indicated generally by reference numeral 40 is mounted on the printed circuit board 16. The terminal 40 has a body 42 which is embedded in the printed circuit board 16 and which is provided with an opening 44 for receiving the central conductor 12. The terminal 40 also has a securing screw 46 for clamping the central conductor 12 in the opening 44.

The connector body 20 and the extension 26 are formed with a through-passage 48 through which the central conductor 12 extends. The passage 48 is co-axial with the connector body 20 and the extension 26, and thus with the connector 10, and the opening 44 is aligned with the passage 48 so as to hold the central conductor 12 co-axial with the passage 48. There is thus provided an air gap 50, of cylindrical shape, between the central conductor 12 and the connector 18 throughout the length of the passage 48.

The terminal 40 provides an electrical connection between the central conductor 12 and the printed circuit board 16, and the connectors 10 and 18 provide an electrical connection between the printed circuit board 16 and the cable outer shield 15 so as to ground the printed circuit board 16 through the connector member 20.

The diameter of passage 48 is predetermined, in accordance with the diameter of the central conductor 12, so that the entry port system acts as a co-axial transmission system having an impedance which is matched to that of the co-axial cable.

More particularly, the impedance of the entry port system can be modeled as a distributed circuit. The central conductor 12 has series resistance and series inductance that combine to form the series impedance of the central conductor 12. The shunt conductance and capacitance between the central conductor 12 and the connector body 20 make up the shunt admittance of the line. The impedance is given by the formula:

$$Z_0 = \frac{60}{\sqrt{\epsilon_R}} \ln \frac{D}{d}$$

where $Z_0$=the characteristic impedance of the line in ohms
60=a constant
$E_r$=the relative dielectric constant of the area between the central conductor 12 and the passage 48
D=the diameter of the passage 48 in inches
d=the outside diameter of the central conductor 12 in inches
By substituting the values of:
$E_r$=1 for air dielectric
D=0.234375 for the diameter of the passage 48
d=0.065 for the diameter of the central conductor 12

$$Z_0 = \frac{60}{\sqrt{1}} \ln \frac{234}{65}$$

we obtain:

$Z_0$=76.95Ω

Thus, the diameters of the central conductor 12 and the passage 48 can be predetermined to provide the entry port with an impedance which matches that of the co-axial cable.

Figure 4:
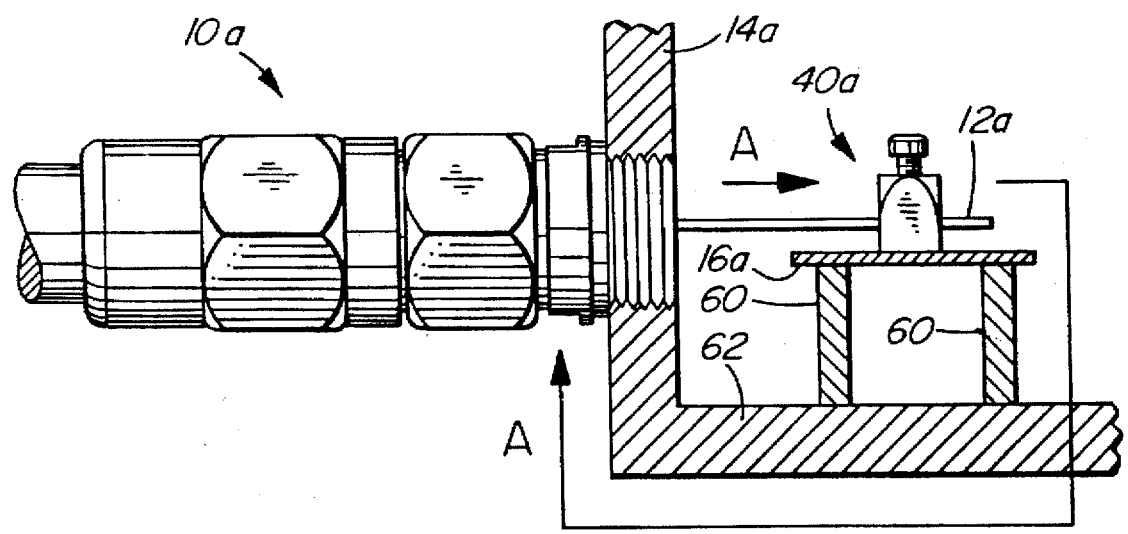
FIG. 4 shows a view in vertical cross-section through a prior art entry port.

FIG. 4 shows the current path through a prior art entry port system.

As shown in FIG. 4, which illustrates the prior art system and in which reference numerals corresponding to those of FIGS. 1-3 but with the suffix "a" added have been employed to facilitate the description, cable terminator connector 10a connects one end of the co-axial cable (not shown in FIG. 4) to housing wall 14a with central conductor 12a of the cable connected by terminal 40a to printed circuit board 16a. In this case, the primed circuit board 16a is mounted on posts 60 extending upwardly from housing base 62, and the current flowing through the central conductor 12a is grounded through a current path, indicated by arrows A, extending through the terminal 40a, the printed circuit board 16a, the posts 60 and the housing base 62 to connect to 10a and then to the cable shield (not shown).

In contrast, the corresponding current path in the present embodiment of the invention, as indicated by arrow B in FIG. 2, is substantially shorter and extends from the terminal 40 through the printed circuit board 16 and then through the connector member 18 and the fastener 28 to the connector 10.

As will be apparent to those skilled in the art, various modifications may be made in the above-described system within the scope of the appended claims.

For example, instead of inserting the edge portion 36 of the printed circuited board 16 into a slot in the connector member 18, it is alternatively possible to secure the edge portion 36 to a flat bottom or top portion of the connector member 18. Also, while four of the screws 38 have been shown in the illustration embodiment of the invention, it is alternatively possible to employ, for example, only a single screw or other fastener for connecting the printed circuit board 16 to the connector 18.

I claim:

1. An entry port system for a co-axial cable having a first central conductor and an outer shield, said entry port system comprising:

a housing;

said housing having a wall and an entry port formed in said wall;

a terminating connector provided at the exterior of said housing at one end of said co-axial cable;

said terminating connector having a second central conductor connected to said first central conductor;

a further connector;

said further connector comprising a connector member located within said housing and a first fastener securing said connector member to said wall at said entry port;

a printed circuit board located within said housing;

a second fastener securing said printed circuit board to said connector member;

said further connector and said terminating connector forming an electrical connection between said printed circuit board and said outer shield of said cable so that said printed circuit board is grounded through said connector member;

said connector member being formed with a passage through which said second central conductor projects into the interior of said housing; and a terminal provided within said housing and electrically connecting said second central conductor to said printed circuit board.

2. An entry port system as claimed in claim 1, wherein said terminal is mounted on said printed circuit board and is formed with an opening for receiving said second central conductor, said opening being aligned with said passage so as to hold said second central conductor at least substantially co-axial with said passage.

3. An entry port system as claimed in claim 1, wherein said second central conductor is surrounded in said passage by an air gap dimensioned so that said entry port system acts as a co-axial transmission system having an impedance substantially equal to that of said co-axial cable.

4. An entry port system as claimed in claim 3, wherein said terminal is mounted on said printed circuit board and is formed with an opening for receiving said second central conductor, said opening being aligned with said passage so as to hold said second central conductor at least substantially co-axial with said passage.

5. An entry port system as claimed in claim 1, wherein said second fastener secures said printed circuit board to said connector member so that said printed circuit board is supported within said housing by said connector member.

6. An entry port system as claimed in claim 5, wherein said connector member is formed with a slot receiving an edge portion of said printed circuit board, and said second fastener comprises at least one screw extending through said connector member, said slot and said printed circuit board for securing the latter in said slot.

7. An entry port system as claimed in claim 5, wherein said terminal is mounted on said printed circuit board and is formed with an opening for receiving said second central conductor, said opening being aligned with said passage so as to hold said second central conductor at least substantially co-axial with said passage.

8. An entry port system as claimed in claim 5, wherein said second central conductor is surrounded throughout said passage by an air gap dimensioned so that said entry port system acts as a co-axial transmission system having an impedance substantially equal to that of said co-axial cable.

9. An entry port system as claimed in claim 8, wherein said terminal is mounted on said printed circuit board and is formed with an opening for receiving said second central conductor, said opening being aligned with said passage so as to hold said second central conductor at least substantially co-axial with said passage.

* * * * *